United States Patent
Huang

(10) Patent No.: US 8,176,395 B2
(45) Date of Patent: May 8, 2012

(54) MEMORY MODULE AND WRITING AND READING METHOD THEREOF

(75) Inventor: Shih-Chang Huang, Penghu County (TW)

(73) Assignee: Macronix International Co., Ltd., Hsinchu (TW)

( * ) Notice: Subject to any disclaimer, the term of this patent is extended or adjusted under 35 U.S.C. 154(b) by 1077 days.

(21) Appl. No.: 11/945,300

(22) Filed: Nov. 27, 2007

(65) Prior Publication Data
US 2009/0138781 A1    May 28, 2009

(51) Int. Cl.
*H03M 13/15* (2006.01)
*H03M 13/00* (2006.01)

(52) U.S. Cl. ........ 714/784; 714/746; 714/752; 714/756; 714/781

(58) Field of Classification Search .................... 714/784
See application file for complete search history.

(56) References Cited

U.S. PATENT DOCUMENTS

| | | | |
|---|---|---|---|
| 4,567,568 A * | 1/1986 | Inagawa et al. | 708/650 |
| 6,353,909 B1 * | 3/2002 | Amrany et al. | 714/757 |
| 2003/0041300 A1 * | 2/2003 | Burns et al. | 714/784 |
| 2004/0098437 A1 * | 5/2004 | Jin et al. | 708/492 |
| 2006/0156202 A1 * | 7/2006 | Takeuchi | 714/776 |
| 2006/0236212 A1 * | 10/2006 | Lee et al. | 714/784 |
| 2007/0150794 A1 * | 6/2007 | Naslund et al. | 714/781 |

* cited by examiner

*Primary Examiner* — Scott Baderman
*Assistant Examiner* — Justin R Knapp
(74) *Attorney, Agent, or Firm* — Thomas|Kayden

(57) ABSTRACT

A writing method of a memory module comprises temporarily storing a piece of $2^m$-byte data as p characters, wherein each character comprises q bits, and m, p and q are positive integers; rearranging the $2^m$-byte data to obtain K symbols, wherein each symbol has m bits and K is a positive integer smaller than $2^m$; encoding the K symbols into a codeword according to a Reed-Solomon (RS)-code algorithm, wherein the codeword comprises N symbols, the codeword has a parity code, the parity code comprises (2T=N−K) symbols, and N and T are positive integers; and writing the p characters and the parity code into a memory-cell array, wherein all the symbols belong to a finite field $GF(2^m)$.

7 Claims, 5 Drawing Sheets

MEMORY MODULE AND WRITING AND READING METHOD THEREOF

BACKGROUND OF THE INVENTION

1. Field of the Invention

The invention relates in general to a memory module and writing and reading method thereof, and more particularly to a memory module which can save hardware structure, and writing and reading method thereof.

2. Description of the Related Art

Memory has been applied in data storage for various purposes today. How to ensure that the data stored in the memory is complete is very essential in memory design. Conventionally, an error correction code (ECC) is used to achieve the above requirement. However, owing that the required memory becomes larger, the conventional ECC for detecting and correcting one bit of error, such as a Hamming code, is not satisfying and has been replaced by ECC capable of detecting and correcting multiple bits of error. The ECC used most commonly today is a Reed-Solomon (RS) code.

The RS code is a (N, K) block code. That is, when data of K symbols is inputted, the K-symbol data will be encoded into a codeword with N symbols. The N symbols include a parity code with (2T=N−K) symbols, all the symbols belong to a finite field $GF(2^m)$, and each symbol has m bits.

Referring to FIG. 1, a schematic diagram of a conventional memory module is shown. A memory module 100 includes an input buffer 110, a page buffer 120, a RS-code encoder 130 and a memory-cell array 140. The memory module 100 is exemplified to receive a piece of $(2^m=512)$-byte data for illustration in the following description, wherein m=9, but the invention is not limited thereto. The piece of data will be temporarily stored in the input buffer 110 first. If the memory module 100 includes 64 sense amplifiers, the $2^9$-byte data will be temporarily stored in the page buffer 120 in a form of 64 bits at a time. That is, the $2^9$-byte data will be temporarily stored as 64 characters and each character includes 64 bits.

Besides, under consideration of the $2^9$-byte data and additional ECCs, when the RS-code algorithm is performed on the $2^9$-byte data, a field conversion of RS codes is needed. That is, it is necessary to convert from the finite field $GF(2^9)$ to the finite field $GF(2^{10})$ for the RS-code algorithm. Therefore, the RS-code encoder 130 is corresponding to the finite field $GF(2^{10})$. The RS-code encoder 130 encodes the $2^9$-byte data into 520 symbols according to the RS-code algorithm, wherein each symbol includes 10 bits. The 520 symbols include a parity code with 8 symbols. Then, the parity code is written into the memory-cell array 140 in the form of 64 bits (if the parity code has fewer bits, the empty bit is set to 0) at a time as well as the 64 characters temporarily stored in the page buffer 120.

Referring to FIG. 2, a schematic diagram of another conventional memory module is shown. A memory module 200 includes a memory-cell array 210, a page buffer 220, a RS-code decoder 230, an exclusive or gate 240 and an output buffer 250. If the memory-cell module 200 has 64 sense amplifiers, the memory-cell array 210 outputs 66 characters, which include data of 64 characters and a parity code of 2 characters. Each character includes 64 bits. The 64-character data is temporarily stored in the page buffer 220 and then outputted in the form of 512 bytes to the exclusive or gate 240.

The 66 characters, outputted by the memory-cell array 210, subtract the bits "0" set as being written, and then are transmitted to the RS-code decoder 230 in the form of 522 bytes. Similar to the RS-code encoder 130 of FIG. 1, the RS-code decoder 230 is also corresponding to the finite field $GF(2^{10})$. After the RS-code decoder 230 has received 522 bytes, a 512-byte ECC is obtained according to the RS-code algorithm, and outputted to the exclusive or gate 240. The exclusive or gate performs an exclusive or operation on the corresponding bits of the 512-byte data and the 512-byte ECC to obtain a piece of 512-byte corrected data. The output buffer 250 temporarily stores and outputs the 512-byte corrected data.

The above memory modules 100 and 200 require field conversion of RS codes for converting toward a higher-order field, such as from the finite field $GF(2^9)$ to the finite field $GF(2^{10})$, during the RS-code algorithm, and thus the used RS-code encoder/decoder requires more inner-circuit components, such as multiplexers or dividers. Consequently, the area of RS-code encoder/decoder and thus the whole hardware cost are increased.

SUMMARY OF THE INVENTION

The invention is directed to a memory module and writing and reading method thereof. Through data rearrangement, a RS-code encoder/decoder with a simpler circuit can be used to write/read data to maintain data correctness.

According to a first aspect of the present invention, a writing method of a memory module is provided. The writing method comprises temporarily storing a piece of $2^m$-byte data as p characters, wherein each character comprises q bits, and m, p and q are positive integers; rearranging the $2^m$-byte data to obtain K symbols, wherein each symbol has m bits and K is a positive integer smaller than $2^m$; encoding the K symbols into a codeword according to a Reed-Solomon (RS)-code algorithm, wherein the codeword comprises N symbols, the codeword has a parity code, the parity code comprises (2T=N−K) symbols, and N and T are positive integers; and writing the p characters and the parity code into a memory-cell array, wherein all the symbols belong to a finite field $GF(2^m)$.

According to a second aspect of the present invention, a memory module is provided. The memory module comprises a page buffer, an encoding unit and a memory-cell array. The page buffer is for temporarily storing a piece of $2^m$-byte data as p characters, wherein each character comprises q bits, and m, p, q are positive integers. The encoding unit is for obtaining a parity code. The encoding unit comprises a first shift register, a RS-code encoder and a second shift register. The first shift register is for rearranging the $2^m$-byte data to obtain K symbols, wherein each symbol has m bits and K is a positive integer smaller than $2^m$. The RS-code encoder is corresponding to a finite field $GF(2^m)$ and for encoding the K symbols into a codeword, wherein the codeword comprises N symbols, the codeword has a parity code, the parity code comprises (2T=N−K) symbols, and N and T are positive integers. The second shift register is for rearranging and converting the N symbols into a piece of $(2^m+(2T\times m/8))$-byte data, wherein the $(2T\times m/8)$ bytes are the parity code. The p characters and the parity code are written into the memory-cell array.

According to a third aspect of the present invention, a reading method of a memory module is provided. The reading method comprises reading x characters from a memory-cell array, wherein each character comprises q bits, the x characters comprise data of p characters and a parity code of (x−p) characters, and x, p and q are positive integers; temporarily storing the p characters as a piece of $2^m$-byte data, wherein m is a positive integer; converting the x characters into a piece of $(2^m+r)$-byte data, and rearranging the $(2^m+r)$-byte data into N symbols, wherein each symbol has m bits, N symbols comprise a parity code with 2T symbols, and r, N and T are positive integers; decoding the N symbols to (K=N−2T) symbols according to a RS-code algorithm and the parity code, wherein K is a positive integer smaller than $2^m$; rearranging the K symbols and obtaining a $2^m$-byte reference code; and correcting the $2^m$-byte data according to the $2^m$-byte reference code to obtain a piece of $2^m$-byte corrected data, wherein all the symbols belong to a finite field GF($2^m$).

According to a fourth aspect of the present invention, a memory module is provided. The memory module comprises a memory-cell array, a page buffer, a decoding unit and a correction unit. The memory-cell array is for transmitting x characters, wherein each character comprises q bits, the x characters comprise data of p characters and a parity code of (x−p) characters, the memory-cell array converts the x characters into a piece of ($2^m$+r)-byte data, and x, p, q, m and r are positive integers. The page buffer is for temporarily storing the p characters into a piece of $2^m$-byte data. The decoding unit is for obtaining a $2^m$-byte reference code. The decoding unit comprises a first shift register, a RS-code decoder and a second shift register. The first register is for rearranging the ($2^m$+r)-byte data to N symbols, wherein each symbol has m bits, N symbols comprise a parity code with 2T symbols, N and T are positive integers. The RS-code decoder is corresponding to a finite field GF($2^m$) for decoding the N symbols into (K=N−2T) symbols according to the parity code, and K is a positive integer smaller than $2^m$. The second shift register is for rearranging the K symbols and obtaining the $2^m$-byte reference code. The correction unit is for correcting the $2^m$-byte data according to the $2^m$-byte reference code to obtain a piece of $2^m$-byte corrected data.

The invention will become apparent from the following detailed description of the preferred but non-limiting embodiments. The following description is made with reference to the accompanying drawings.

DETAILED DESCRIPTION OF THE INVENTION

The invention is directed to a memory module and writing and reading method thereof. Through data rearrangement, a RS-code encoder/decoder corresponding to a lower-order finite field can be used to write/read data in order to maintain data correctness.

Figure 1:
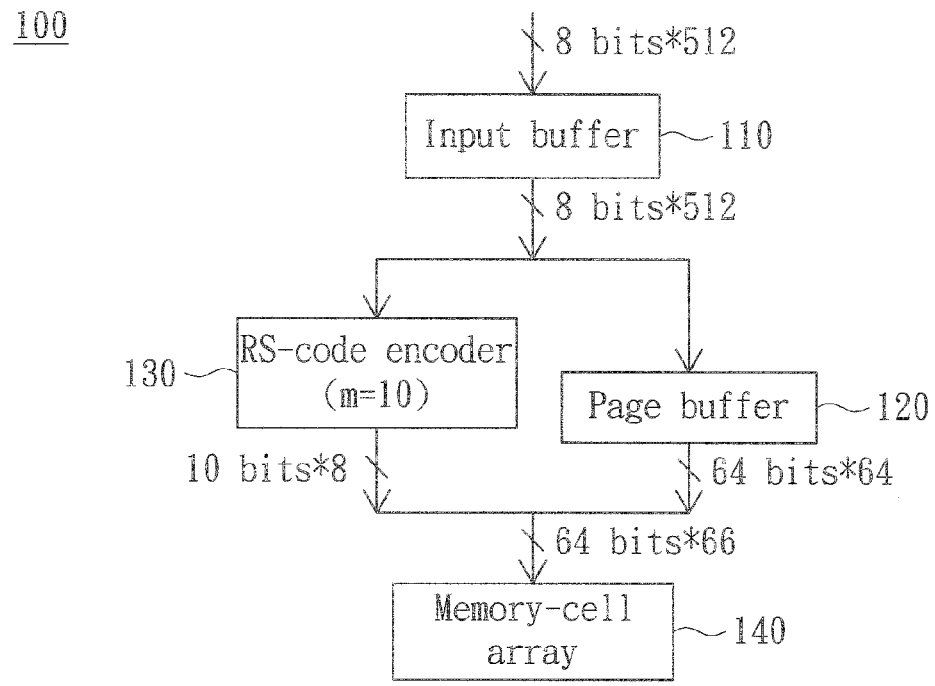
FIG. 1 is a schematic diagram of a conventional memory module.
Figure 2:
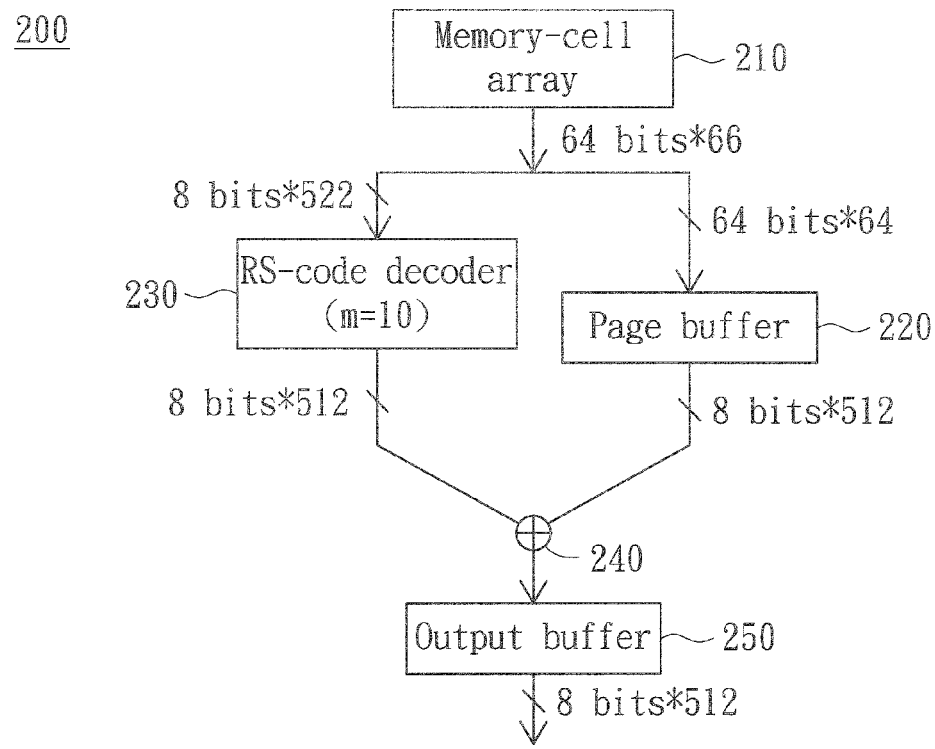
FIG. 2 is a schematic diagram of another conventional memory module.
Figure 3:
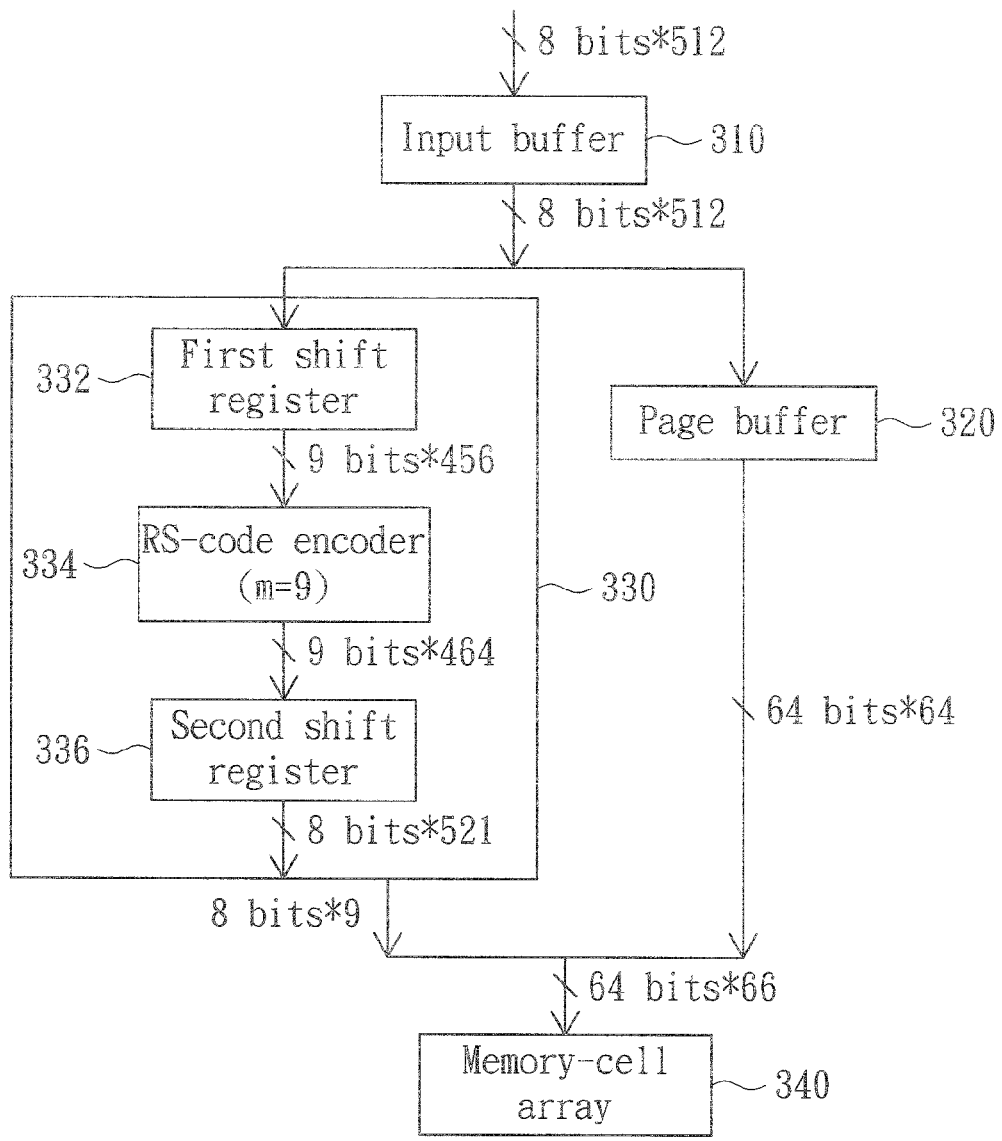
FIG. 3 is a schematic diagram of a memory module according to the preferred embodiment of the invention.

Referring to FIG. 3, a schematic diagram of a memory module according to the preferred embodiment of the invention is shown. A memory module 300 includes an input buffer 310, a page buffer 320, an encoding unit 330 and a memory-cell array 340. The encoding unit 330 includes a first shift register 332, a RS-code encoder 334 and a second shift register 336. The memory module 300 is exemplified to receive a piece of ($2^m$=512)-byte data for illustration in the following description, wherein m=9, but the invention is not limited thereto.

The input buffer 310 receives and temporarily stores a piece of ($2^m$=512)-byte data. If the memory module 300 has 64 sense amplifiers, the $2^9$-byte data will be temporarily stored in the page buffer 320 in the form of 64 bits at a time. That is, the $2^9$-byte data will be temporarily stored as 64 characters and each character includes 64 bits.

The encoding unit 330 is used for obtaining a parity code. First, the first shift register 332 temporarily stores and rearranges the $2^9$-byte data to obtain 456 symbols, each of which has 9 bits, wherein the empty bit of the last symbol is set to 0. Because 456 is smaller than $2^9$, even the additional ECC is considered, the field conversion of RS codes is still unnecessary during the RS-code algorithm, that is, the finite field GF($2^9$) is maintained in the process of the RS-code algorithm. The first shift register 332 is for reducing the number of the symbols received by the RS-code encoder 334 to substantially perform an order reduction of the RS-code algorithm.

The RS-code encoder 334, corresponding to the finite field GF($2^9$), is for encoding the 456 symbols to a codeword with 464 symbols. The codeword includes a parity code with (464−456=8) symbols and can correct 4 symbols (36 bits) of error at most. The second shift register 336 rearranges and converts the 464 symbols to a piece of ($2^9$+9=521)-byte data, wherein the 9 bytes are the parity code. The encoding unit 330 outputs the 9-byte parity code. The 9-byte parity code is converted to 2 characters, and the empty bit of the last character is set to 0. The parity code of 2 characters and the 64-character data outputted by the page buffer 320 are written into the memory-cell array 340.

Figure 4:
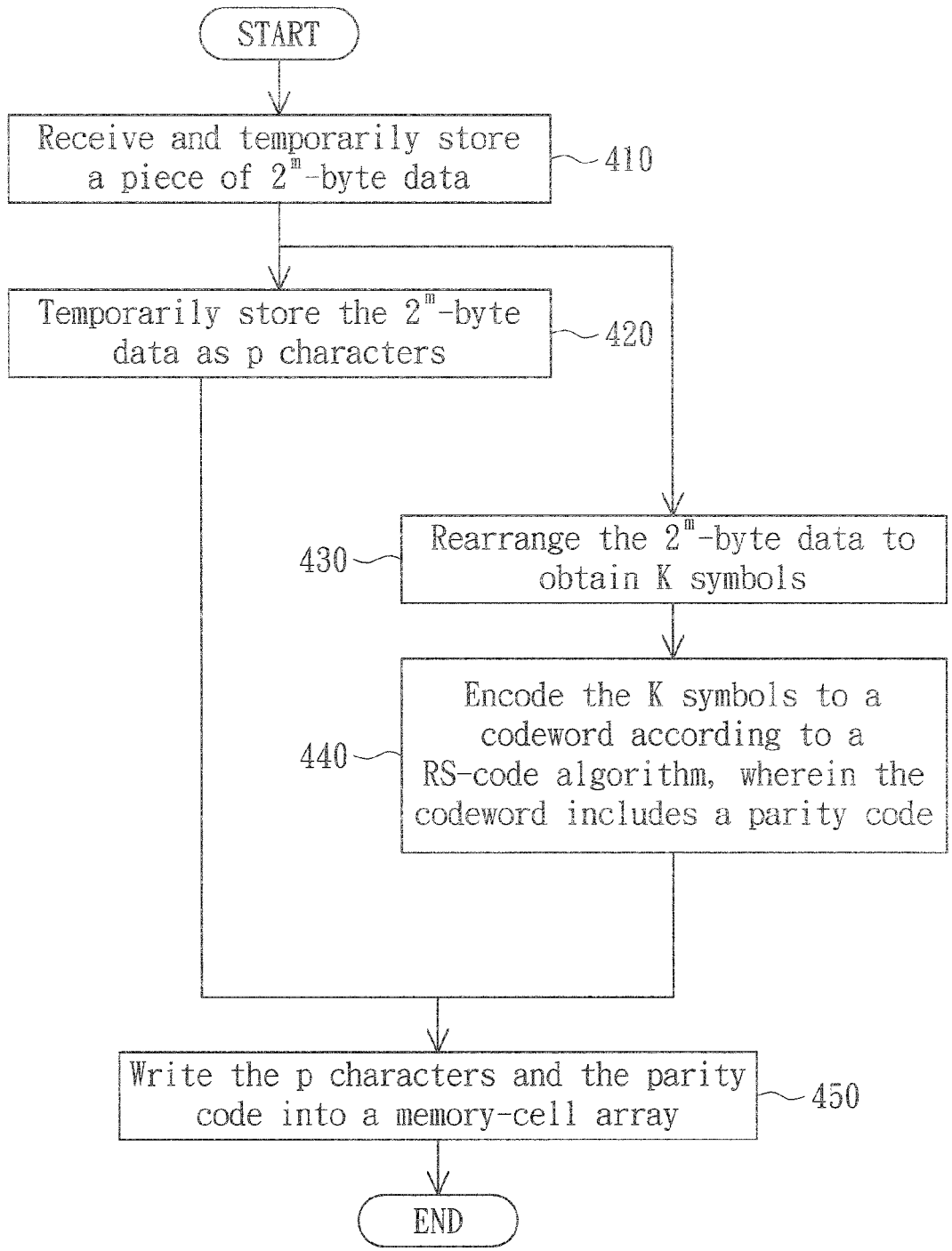
FIG. 4 is a flow chart of a writing method of a memory module according to the preferred embodiment of the invention.

Referring to FIG. 4, a flow chart of a writing method of a memory module according to the preferred embodiment of the invention is shown. First, in step 410, receive and temporarily store a piece of $2^m$-byte data, wherein m is a positive integer. Following that, in step 420, temporarily store the $2^m$-byte data as p characters, each of which has q bits, wherein p and q are positive integers. At the same time, in step 430, rearrange the $2^m$-byte data to obtain K symbols, each of which has m bits, wherein K is a positive integer smaller than $2^m$. The K symbols belong to a finite field GF($2^m$). The step 430 is substantially performing an order reduction of RS-code algorithm.

Next, in step 440, encode the K symbols to a codeword according to a RS-code algorithm. The codeword includes N symbols. The code word has a parity code. The parity code includes (2T=N−K) symbols, wherein N and T are positive integers. The parity code with 2T symbols can correct T symbols of error at most. The N symbols belong to the finite field GF($2^m$). Afterwards, in step 450, write the p characters and the parity code into a memory-cell array. The parity code with 2T symbols is converted to ([2T×m/q]+1) characters and then written to the memory-cell array.

Compared to the conventional memory module 100, the above memory module 300 and the writing method thereof use the first shift register 332 and the second shift register 336 to rearrange data and thus the field conversion of RS codes is not necessary during RS-code algorithm. Therefore, the RS-code algorithm can be performed in the original finite field and the data correctness can be maintained. Although the encoding unit 330, as compared to the RS-code encoder 130, has extra first shift register 332 and second shift register 336, the RS-code encoder 334 has fewer inner circuit components (such as the large-area multiplexers or dividers) than the RS-code encoder 130, and thus more area can be saved, and the whole hardware cost is reduced. Besides, the parity code is reduced to 9 bytes from 10 bytes, and thus the data amount for each page can be reduced by 8 bits.

Figure 5:
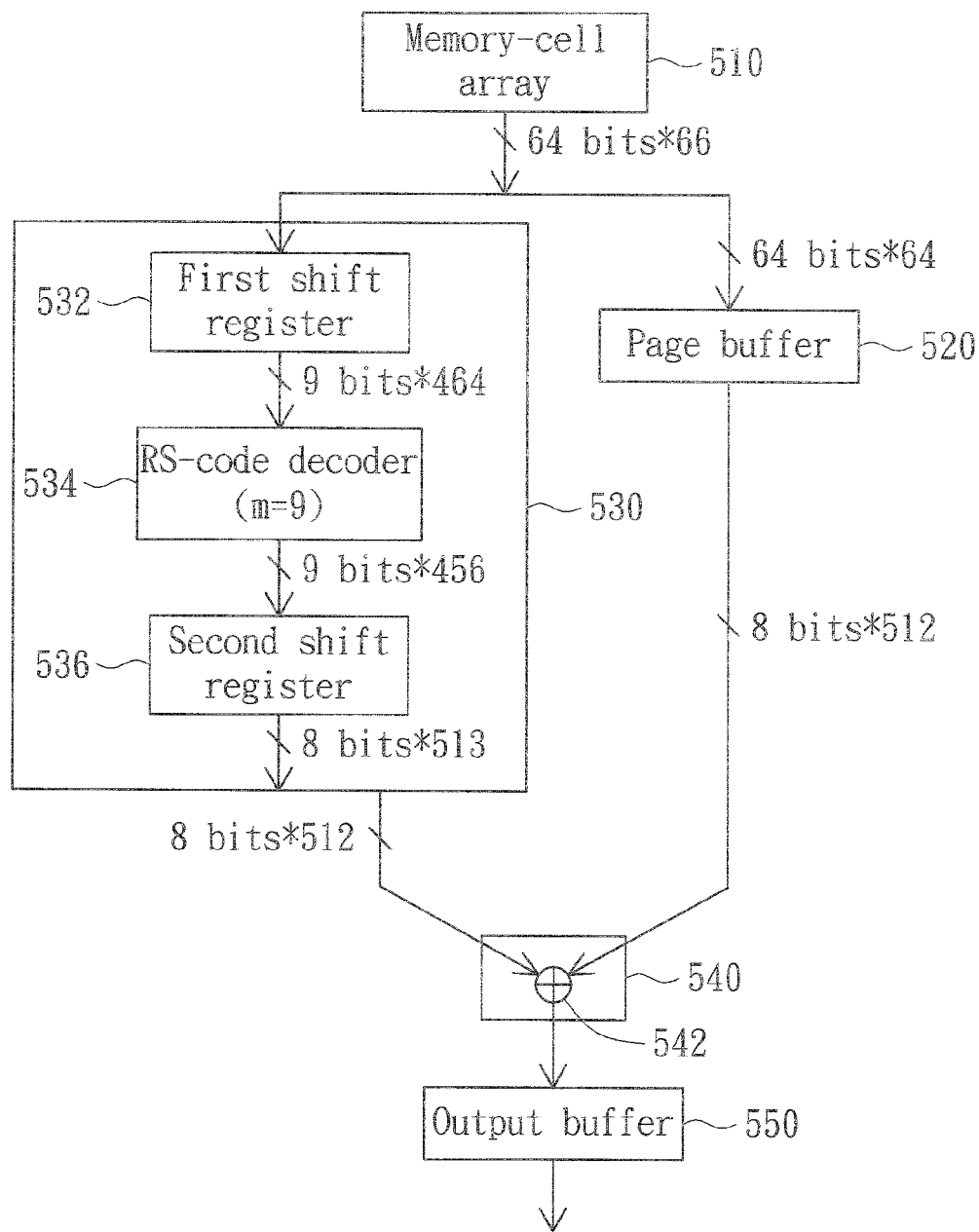
FIG. 5 is a schematic diagram of another memory module according to the preferred embodiment of the invention.

Referring to FIG. 5, a schematic diagram of another memory module according to the preferred embodiment of the invention is shown. A memory module 500 includes a memory-cell array 510, a page buffer 520, a decoding unit 530, a correction unit 540 and an output buffer 550. The decoding unit 530 includes a first register 532, a RS-code decoder 534 and a second shift register 536. In the following description, FIG. 3 is continuously used for illustration, but the invention is not limited thereto.

If the memory module 500 includes 64 sense amplifiers, the memory-cell array 510 transmits 66 characters, each of which has 64 bits. The 66 characters include data of 64 characters and a parity code of 2 characters. Subtracting the bits "0" set in the last character of the parity code, the memory-cell array 510 converts the 66 characters into a piece of ($2^9$+10=522)-byte data. The page buffer 520 is used for temporarily storing the 64-character data as a piece of $2^9$-byte data.

The decoding unit 530 is used for obtaining a $2^9$-byte reference code. First, the first shift register 532 rearranges the 522-byte data to be 464 symbols, each of which has 9 bits. The 464 symbols include a parity code with 8 symbols and can correct 4 symbols (36 bits) of error at most. Because 456 is smaller than 29, the finite field $GF(2^9)$ can be applied in the RS-code algorithm, which is not necessarily converted to the finite field $GF(2^{10})$.

The RS-code decoder 534, corresponding to the finite field $GF(2^9)$, is for decoding the 464 symbols to (464−8=456) symbols according to the 8-symbol parity code. Subtracting the bits "0" set in the last symbol, the second shift register 536 rearranges the 456 symbols and obtains a $2^9$-byte reference code. The second shift register 536 substantially rearranges the 456 symbols and obtains the address of the data having errors. And accordingly the second shift register 536 generates an error equation. The second shift register 536 outputs the $2^9$-byte reference code in a chin search manner according to the error equation. And if the bit of the reference code is "0", it represents the corresponding bit of the data outputted by the page buffer 520 is correct, while if the bit of the reference code is "1", it represents the corresponding bit of the data outputted by the page buffer 520 is incorrect.

The correction unit 540 is for correcting the $2^m$-byte data outputted by the page buffer 520 according to the $2^m$-byte reference code outputted by the decoding unit 530 to obtain a piece of $2^m$-byte corrected data. The correction unit 540 substantially includes an exclusive or gate 542 for performing an exclusive or operation on the corresponding bits of the $2^m$-byte data and the $2^m$-byte reference code to obtain the $2^m$-byte corrected data. The output buffer 550 outputs the $2^m$-byte corrected data. The output buffer 550 is substantially for driving back-end circuits.

Figure 6:
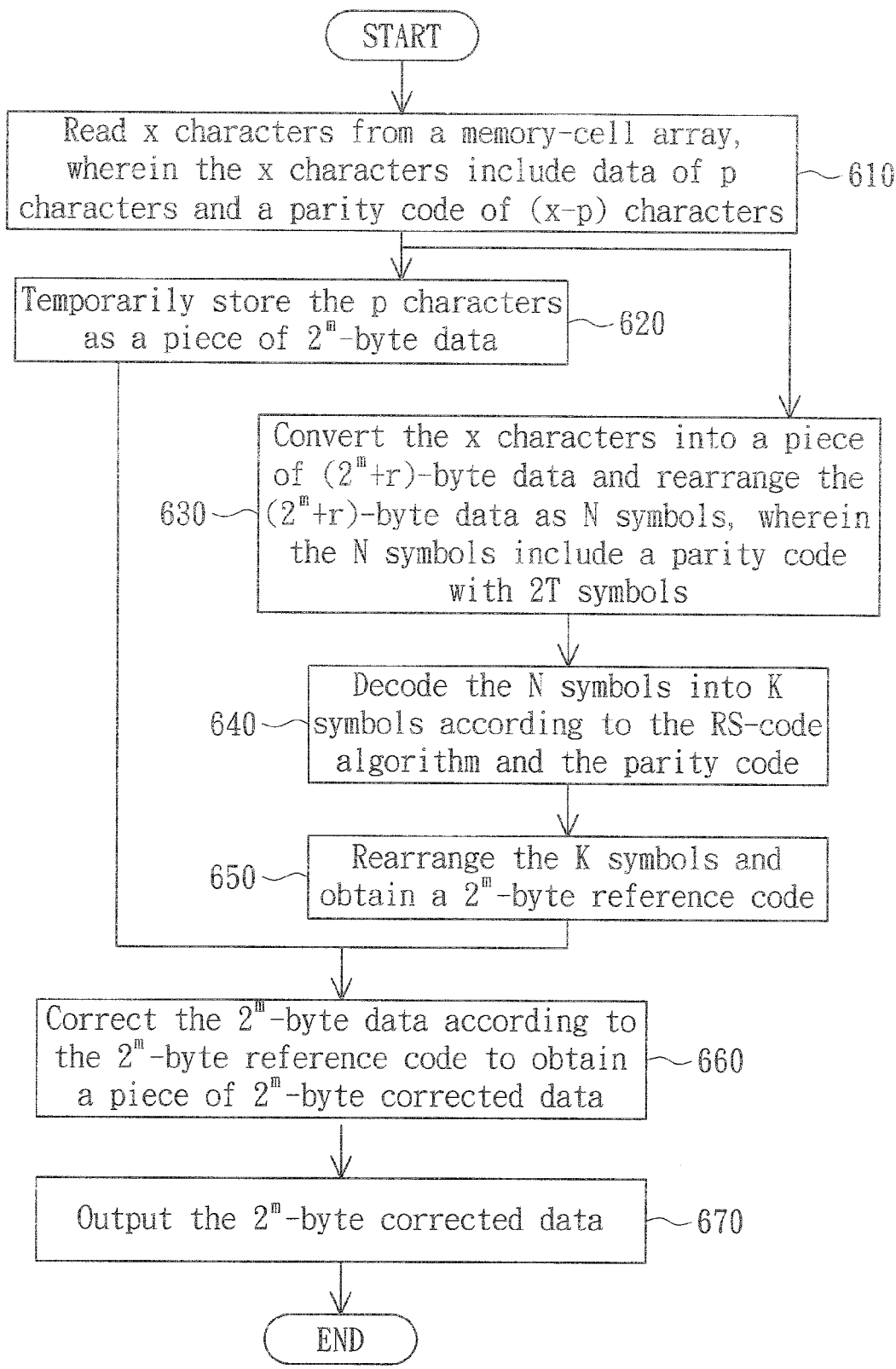
FIG. 6 is a flow chart of a reading method of a memory module according to the preferred embodiment of the invention.

Referring to FIG. 6, a flow chart of a reading method of a memory module according to the preferred embodiment of the invention is shown. First, in step 610, read x characters, each of which has q bits, from a memory-cell array, wherein the x characters include data of p characters and a parity code of (x−p) characters, and x, p and q are positive integers. Following that, in step 620, temporarily store the p characters as a piece of $2^m$-byte data, wherein m is a positive integer.

At the same time, in step 630, convert the x characters into a piece ($2^m$+r)-byte data and rearrange the ($2^m$+r)-byte data as N symbols, wherein each symbol has m bits, the N symbols include a parity code with 2T symbols, and r, N and T are positive integers. The N symbols belong to a finite field $GF(2^m)$. Next, in step 640, decode the N symbols into (K=N−2T) symbols, wherein K is a positive integer smaller than $2^m$. The K symbols also belong to the finite field $GF(2^m)$.

Afterwards, in step 650, rearrange the K symbols and obtain a $2^m$-byte reference code. Then, in step 660, correct the $2^m$-byte data according to the $2^m$-byte reference code to obtain a piece of $2^m$-byte corrected data. An exclusive or operation is performed on the corresponding bits of the $2^m$-byte data and the $2^m$-byte reference code to obtain the $2^m$-byte corrected data. Finally, in step 670, output the $2^m$-byte corrected data.

Compared to the conventional memory module 200, the above memory module 500 and the read method thereof use the first shift register 532 and the second shift register 536 to rearrange data and thus the field conversion of RS codes is not necessary during RS-code algorithm. Therefore, the RS-code algorithm can be performed in the original finite field and the data correctness can be maintained. Although the decoding unit 530, as compared to the RS-code decoder 230, has the extra first shift register 532 and second shift register 536, the RS-code decoder 534 has fewer inner circuit components (such as the large-area multiplexers or dividers) than the RS-code decoder 230, and thus more area can be saved, and the whole hardware cost is reduced. Besides, the parity code is reduced to 9 bytes from 10 bytes, and thus the data amount for each page can be reduced by 8 bits.

The memory module and the writing and reading method thereof disclosed in the above embodiments of the invention require no field conversion of RS codes in RS-code algorithm by data rearrangement. Therefore, a RS-code encoder/decoder corresponding to a lower-order finite field can be used to write/read data in order to save more area, reduce the whole hardware cost, and maintain data correctness.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A writing method of a memory module, comprising:
   temporarily storing a piece of $2^m$-byte data as p characters, wherein each character comprises q bits, and m, p and q are positive integers;
   rearranging the $2^m$-byte data to obtain K symbols, wherein each symbol has m bits and K is a positive integer smaller than $2^m$;
   encoding the K symbols into a codeword according to a Reed-Solomon (RS)-code algorithm, wherein the codeword comprises N symbols, the codeword has a parity code, the parity code comprises (2T=N−K) symbols, and N and T are positive integers;
   rearranging and converting the N symbols into a piece of ($2^m$+(2T×m/8))-byte data, wherein the (2T×m/8) bytes are the parity code; and
   writing the p characters and the parity code into a memory-cell array, wherein all the symbols belong to a finite field $GF(2^m)$.

2. The writing method according to claim 1, wherein the parity code with the 2T symbols is converted to ([2T×m/q]+1) characters and then written to the memory-cell array.

3. The writing method according to claim 1, further comprising:
   receiving and temporarily storing the $2^m$-byte data.

4. A memory module, comprising:
a page buffer, for temporarily storing a piece of $2^m$-byte data as p characters, wherein each character comprises q bits, and m, p, q are positive integers;
an encoding unit, for obtaining a parity code, the encoding unit comprising:
a first shift register, for rearranging the $2^m$-byte data to obtain K symbols, wherein each symbol has m bits and K is a positive integer smaller than $2^m$;
a RS-code encoder, corresponding to a finite field $GF(2^m)$, for encoding the K symbols into a codeword, wherein the codeword comprises N symbols, the codeword has a parity code, the parity code comprises (2T=N−K) symbols, and N and T are positive integers; and
a second shift register, for rearranging and converting the N symbols into a piece of $(2^m+(2T\times m/8))$-byte data, wherein the (2T×m/8) bytes are the parity code; and
a memory-cell array, wherein the p characters and the parity code are written into the memory-cell array.

5. The memory module according to claim 4, wherein the parity code with the (2T×m/8) bytes is converted to ([2T×m/q]+1) characters and then written to the memory-cell array.

6. The memory module according to claim 4, further comprising q sense amplifiers, wherein the page buffer temporarily stores the $2^m$-byte data to be the p characters, each of which comprises q bits, in correspondence with the q sense amplifiers.

7. The memory module according to claim 4, further comprising an input buffer for receiving and temporarily storing the $2^m$-byte data.

* * * * *